(12) United States Patent
Im

(10) Patent No.: US 6,603,684 B2
(45) Date of Patent: Aug. 5, 2003

(54) SEMICONDUCTOR MEMORY DEVICE HAVING NOISE TOLERANT INPUT BUFFER

(75) Inventor: Heung-Soo Im, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/124,854

(22) Filed: Apr. 18, 2002

(65) Prior Publication Data

US 2002/0171437 A1 Nov. 21, 2002

(30) Foreign Application Priority Data

Apr. 18, 2001 (KR) ........................................ 2001/20784

(51) Int. Cl.⁷ ............................................... G11C 7/00
(52) U.S. Cl. ..................... 365/189.05; 365/191; 326/21; 327/379
(58) Field of Search ............................ 365/189.05, 191, 365/193; 326/21, 26; 327/379, 384

(56) References Cited

U.S. PATENT DOCUMENTS 4,983,861 A * 1/1991 Kikuchi et al. ............... 326/14
5,149,990 A * 9/1992 Yamazaki et al. ............. 326/21
5,680,352 A * 10/1997 Roohparvar ............ 365/189.05
5,883,847 A * 3/1999 Takahashi ............... 365/189.05
6,026,052 A * 2/2000 Fukutani et al. .......... 365/233.5

* cited by examiner

*Primary Examiner*—Son Mai
(74) *Attorney, Agent, or Firm*—F. Chau & Associates, LLP

(57) ABSTRACT

A semiconductor memory device is provided, which includes a chip enable buffer and an address buffer. The chip enable buffer generates first and second control signals having opposite phases of logic, the first and second control signals enable and disable operations of the semiconductor memory device, respectively. The address buffer includes an input terminal, and a blocking terminal connected to the input terminal, the input terminal receiving an external address signal under control of the first control signal, and the blocking terminal generating an address signal in response to the second control signal. The address buffer further includes a shift detecting circuit connected to the blocking terminal for generating first and second short pulses by detecting shift of the address signal, wherein the pluses are used as signals for reading data of the semiconductor memory device.

20 Claims, 11 Drawing Sheets

SEMICONDUCTOR MEMORY DEVICE HAVING NOISE TOLERANT INPUT BUFFER

BACKGROUND OF THE INVENTION

1. Field of the Invention

The present invention relates to a semiconductor memory device and, more particularly, to a semiconductor memory device having noise tolerant input buffer.

2. Brief Description of the Related Art

Higher level of integration, higher speed of operation, and lower power consumption had been and still are design goals for semiconductor memory device designers. The increased operational speed in the devices requires increased switching, increased current surges, and thereby increased occurrences of noise. The higher speed memory devices therefore operate in a noiser environment. When not properly controlled, noise can cause false operations in data and address signaling and read/write operations, rendering the device unreliable or even useless.

FIG. 1 is a structure of a conventional address buffer in a semiconductor memory device. Referring to FIG. 1, the address buffer includes a NOR gate 1 receiving an external address signal XAi and a chip enable buffer signal /CE, a plurality of inverters 2–5 connected to the NOR gate 1 in series, first and second short pulse generators 7 and 8 connected to the inverter 5, and an inverter 6 connected to the inverter 5. The first short pulse generator 7 generates a first short pulse having logic 'high' SPGHi and the second short pulse generator 8 generates a second short pulse having logic 'low' SPGLi. The address buffer is used to buffer the external address signal XAi, generate an address signal Ai in response to the chip enable buffer signal /CE, and transfer the output signal Ai to a memory cell array of the semiconductor device.

FIG. 2 is a structure of a conventional chip enable buffer for buffering an external chip enable buffer signal /XCE and generating a chip enable buffer signal /CE. The chip enable buffer includes a NOR gate 11 receiving an external chip enable signal /XCE, a plurality of inverters 11–15 connected to the NOR gate 11, a third short pulse generator 17 connected to the inverter 15 for generating a chip enable short pulse signal CESP, and an inverter 16 connected to the inverter 15. Customarily, if the external chip enable signal /XCE is logic 'high,' the semiconductor device is disabled or put in a standby mode and if the external chip enable signal /XCE is logic 'low,' the semiconductor device is enabled. When the semiconductor device is on standby, it consumes only a small amount of current. The chip enable short pulse signal CESP generated by the third short pulse generator 17 is a control signal for transferring the first short pulse having logic 'high' SPGHi and the second short pulse having logic 'low' SPGLi into a sense amplifier control circuit when the external chip enable signal /XCE is shifted from logic 'high' to 'low' or from logic 'low' to 'high'.

FIG. 3 is a block diagram of a conventional semiconductor memory device for reading data. The conventional memory device includes an address buffer 10, a chip enable buffer 20, a decoder 30, a summator 40, a memory cell array 50, a sense amplifier control circuit 60, a sense amplifier 70, and a data output buffer 80.

The function and internal circuits of the address buffer 10 and chip enable buffer 20 are described above with reference to FIGS. 1 and 2. The summator 40 is a circuit for generating another short pulse when any short pulse is generated at the address buffer 10 and chip enable buffer 20. The sense amplifier control circuit 60 is driven by the short pulse generated at the summator 40 and is for controlling the sense amplifier 70 at a desired time.

FIG. 4 is an operational timing diagram of the signals of the conventional semiconductor memory device shown in FIG. 3. If the external chip enable signal /XCE includes noise while the chip enable buffer 20 is enabled, the noise can be amplified by the chip enable buffer 20 and a false pulse can be generated. The false pulse can cause a read operation when no read was intended. In most memory devices, the read operation will clear the data stored in the cell.

As described above, a problem in a conventional semiconductor memory device is that the semiconductor memory device performs false operations if noise is present in the chip enable buffer. Thus, a need exists for a semiconductor device having a noise tolerant chip enable buffer.

SUMMARY OF THE INVENTION

A semiconductor memory device is provided, which includes: a chip enable buffer generating first and second control signals having opposite phases of logic, the first and second control signals enabling and disabling operations of the semiconductor memory device, respectively; and an address buffer comprising an input terminal, and a blocking terminal connected to the input terminal, the input terminal receiving an external address signal under control of the first control signal, and the blocking terminal generating an address signal in response to the second control signal.

According to an embodiment of the present invention, the address buffer further includes a shift detecting circuit connected to the blocking terminal for generating first and second short pulses by detecting shift of the address signal, wherein the pluses are used as signals for reading data of the semiconductor memory device. The address buffer further includes an inverter between the blocking terminal and the shift detecting circuit.

According to an embodiment of the present invention, the shift detecting circuit includes: a first short pulse generator generating the first short pulse when the shift of the address signal is changed from logic 'low' in logic 'high' and a second short pulse generator generating the second short pulse when the shift of the address signal is changed from logic 'high' in logic 'low'. The input terminal includes a NOR gate receiving the external address signal and the input terminal generates a data-in signal in response to the first control signal. The input terminal further includes an inverter.

The input terminal includes a NAND gate receiving the external address signal and generating a data-in signal in response to the first control signal. The blocking terminal includes: a switch receiving the data-in signal and generating an output signal by opening or closing in response to the second control signal; and a latch for storing the output signal, preventing generation of a false pulse due to noise, and generating the address signal. The switch includes: first and second PMOS transistors; and first and second NMOS transistors, wherein the first PMOS transistor, the second PMOS transistor, the first NMOS transistor, ant the second NMOS transistor are connected in series, the first PMOS transistor is connected to logic 'high' and the second NMOS transistor is connected to logic 'low', the data-in signal is input to gates of the second PMOS transistor and the first NMOS transistor, the second control signal is connected to gates of the second NMOS transistor and the first PMOS transistor through an inverter, and the output signal of the switch is connected to a connecting node of the second PMOS transistor and the first NMOS transistor. The switch includes: interconnected PMOS and NMOS transistors; and an inverter, wherein the data-in signal is input to one side of the interconnected PMOS and NMOS transistors, and the second control signal is input to a gate of the NMOS transistor and a gate of the PMOS transistor through the inverter. The chip enable buffer includes: a input part receiving an external chip enable signal and generating the first control signal; and a plurality of inverters in series connected to the input part for amplifying the first control signal; an inverter for generating the second control signal, wherein the inverter connected to the plurality of inverters. The input part is a NOR gate.

A semiconductor memory device is also provided, which includes: a chip enable buffer generating first and second control signals having opposite phases of logic, the first and second control signal enabling or disabling operations of the semiconductor memory device; an address buffer receiving an external address signal controlled by the first control signal and, generating an address signal in response to the second control signal, and generating first and second short pulses by detecting shift of the address signal; a memory cell array including memory cell transistors having data, the memory cell array receiving the address signal; a sense amplifier control circuit for receiving the first and second short pulses; and a sense amplifier for reading the data in the memory cell array in response to the first and second short pulses.

According to an embodiment of the present invention, the chip enable buffer includes: a input part receiving an external chip enable signal and generating the first control signal; and a plurality of inverters in series connected to the input part for amplifying the first control signal; an inverter for generating the second control signal, wherein the inverter connected to the plurality of inverters. The address buffer includes an input terminal, and a blocking terminal connected to the input terminal, the input terminal receiving an external address signal controlled by the first control signal, the blocking terminal generating an address signal in response to the second control signal, and a shift detecting circuit connected to the blocking terminal for generating first and second short pulses by detecting shift of the address signal.

According to an embodiment of the present invention, the semiconductor memory device further includes an inverter between the blocking terminal and the shift detecting circuit. The shift detecting circuit includes: a first short pulse generator generating the first short pulse when the shift of the address signal is changed from logic 'low' to logic 'high' and a second short pulse generator generating the second short pulse when the shift of the address signal is changed from logic 'high' to logic 'low'.

A method for generating an address signal in a semiconductor memory device is also provided, the method includes the steps of: generating first and second control signals; receiving an external address signal in response to the first control signal; and generating the address signal by filtering the external address signal in response to the second control signal.

According to an embodiment of the present invention, the first and second control signals are opposite phase each other. The method further includes the steps of; generating a first short pulse when shift of the address signal is changed from logic 'low' to logic 'high' and generating a second short pulse when shift of the address signal is changed from logic 'high' to logic 'low'.

BRIEF DESCRIPTION OF THE DRAWINGS

For fuller understanding of the nature and object of the invention, reference should be made to the following detailed description taken in conjunction with the accompanying drawings in which.

DETAILED DESCRIPTION OF THE INVENTION

Figure 1:
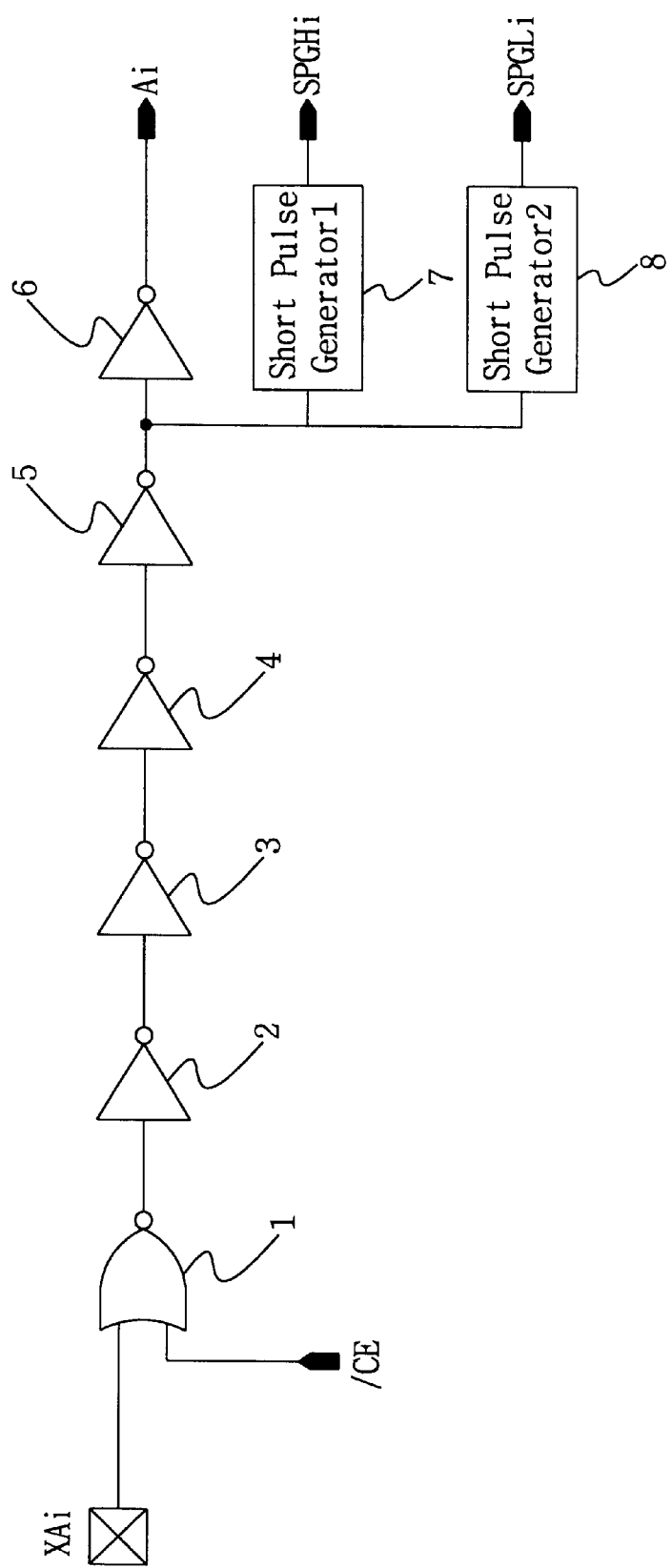
FIG. 1 is a circuit diagram of a conventional address buffer of a semiconductor memory device.
Figure 2:
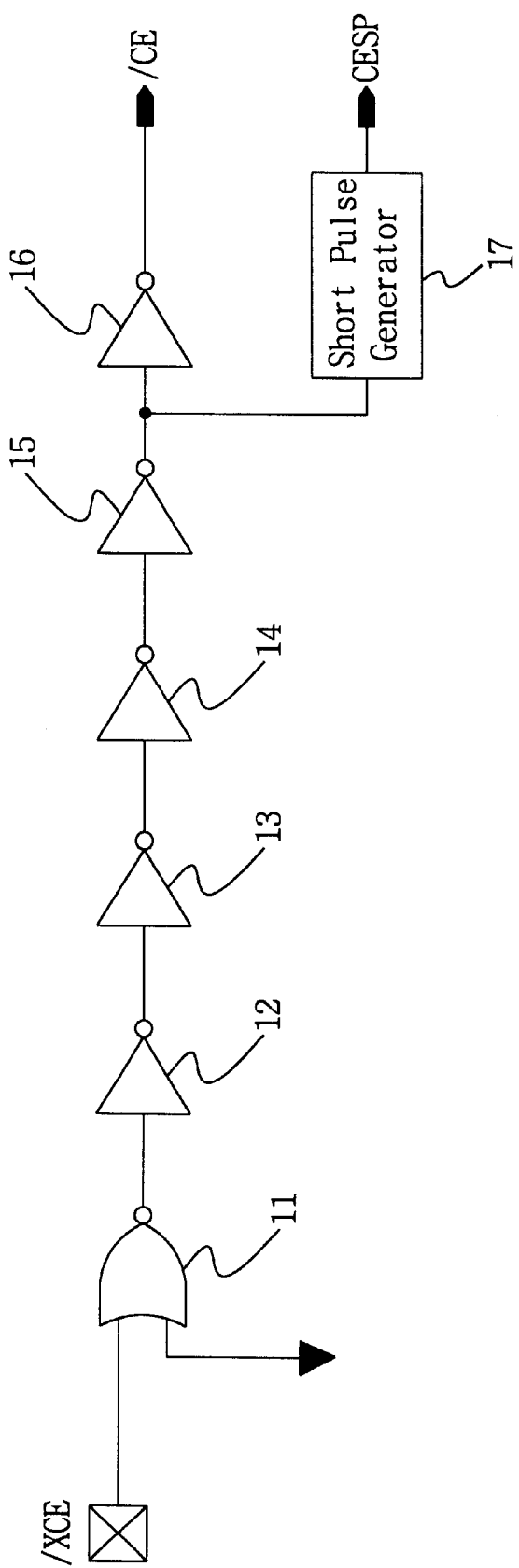
FIG. 2 is a circuit diagram of a conventional chip enable buffer of a semiconductor memory device.
Figure 3:
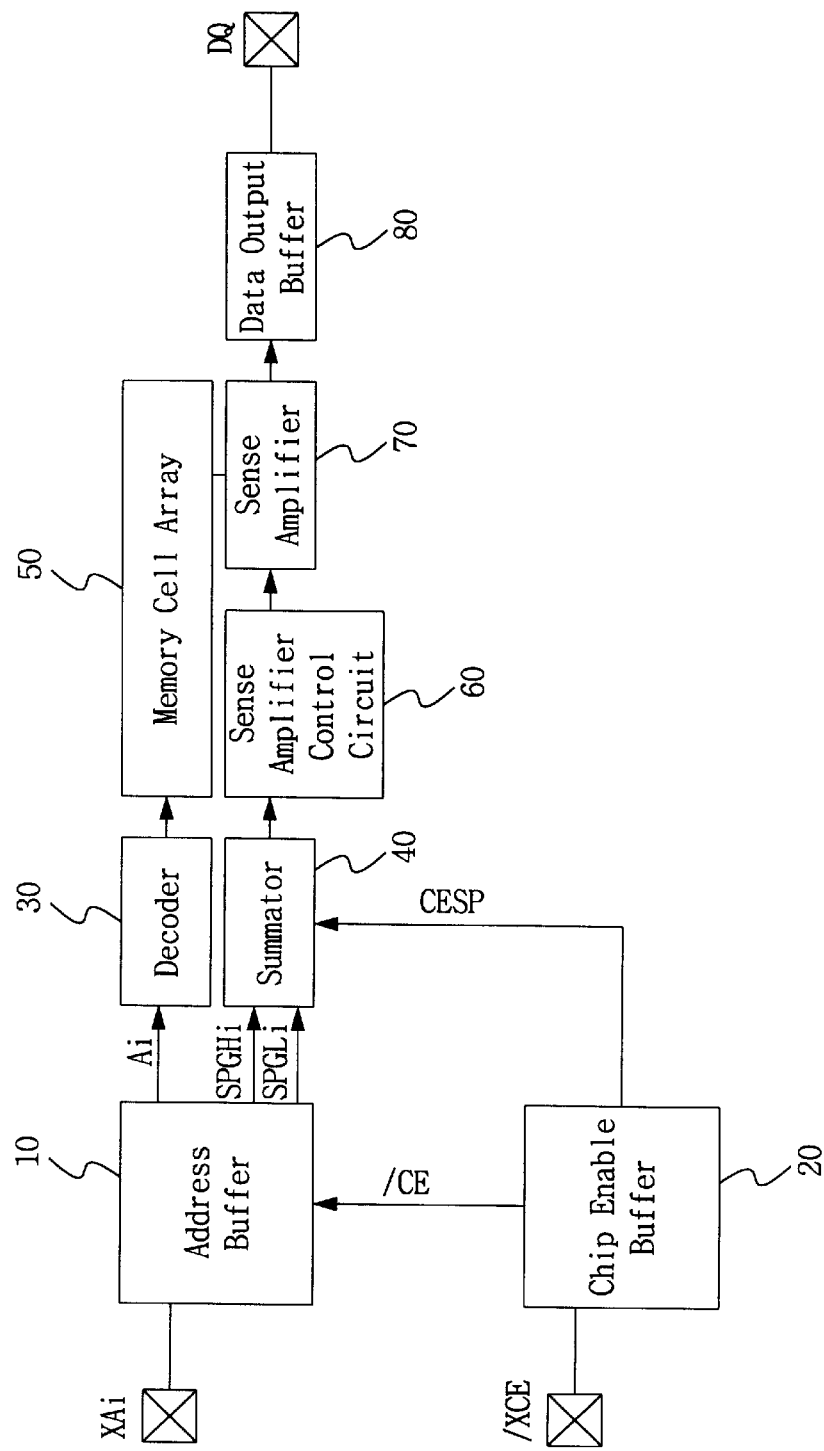
FIG. 3 is a block diagram of a conventional semiconductor memory device for reading data.
Figure 4:
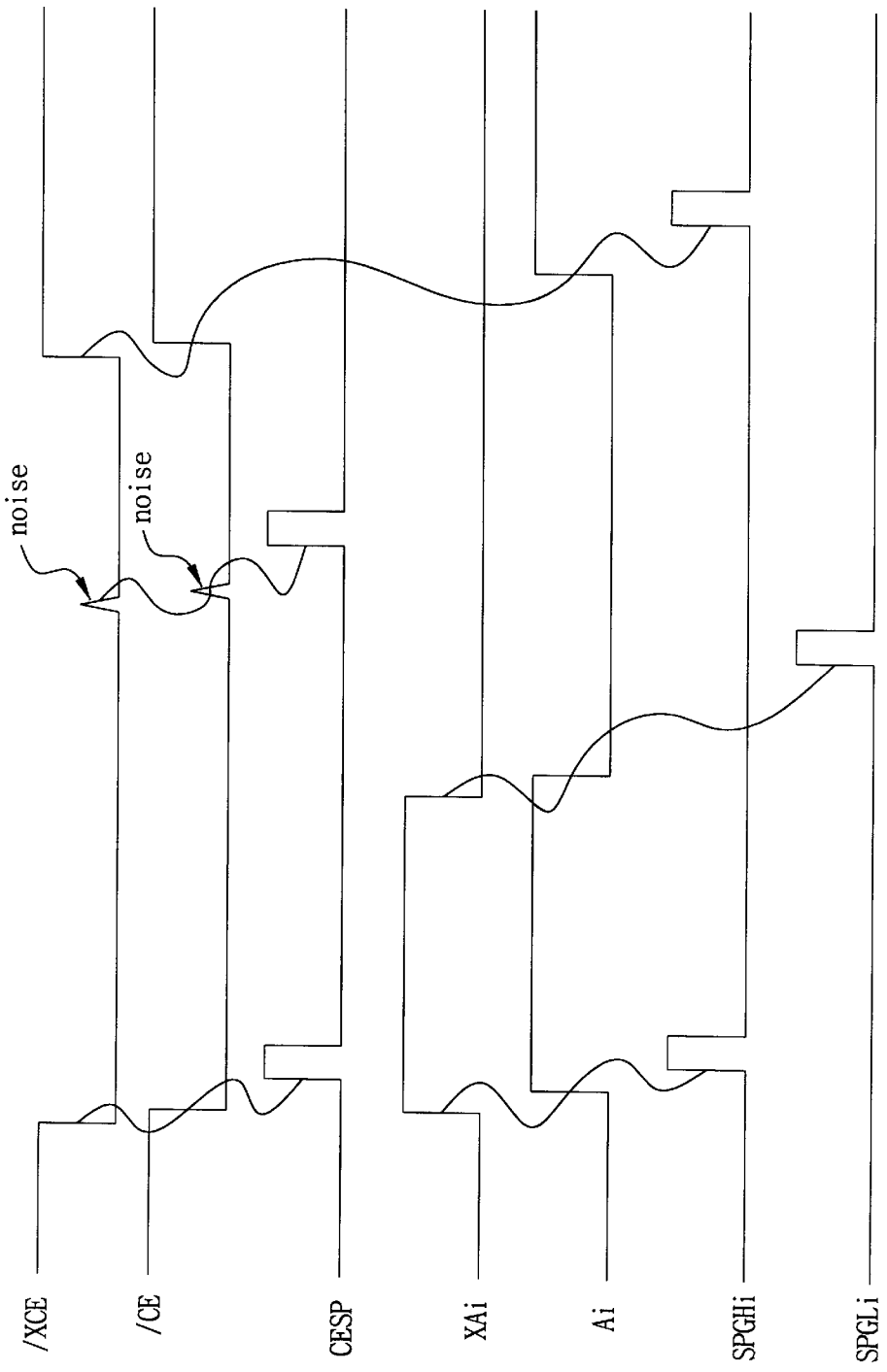
FIG. 4 is an operational timing diagram of the semiconductor memory device shown in FIG. 3.

Hereinafter, preferred embodiments of the present invention will be described in detail with reference to accompanying drawings. It should be noted that the same reference numerals are used for the same parts shown in all the drawings. Besides, a number of details have been made in the following description like a specific processing flow chart to provide a more thorough understanding for the present invention. It is apparent to the people skilled in the field that the present invention can be applied without description of particular parts. Furthermore, descriptions about well-known functions and parts will be omitted to avoid confusion about the key points of the present invention.

Figure 5:
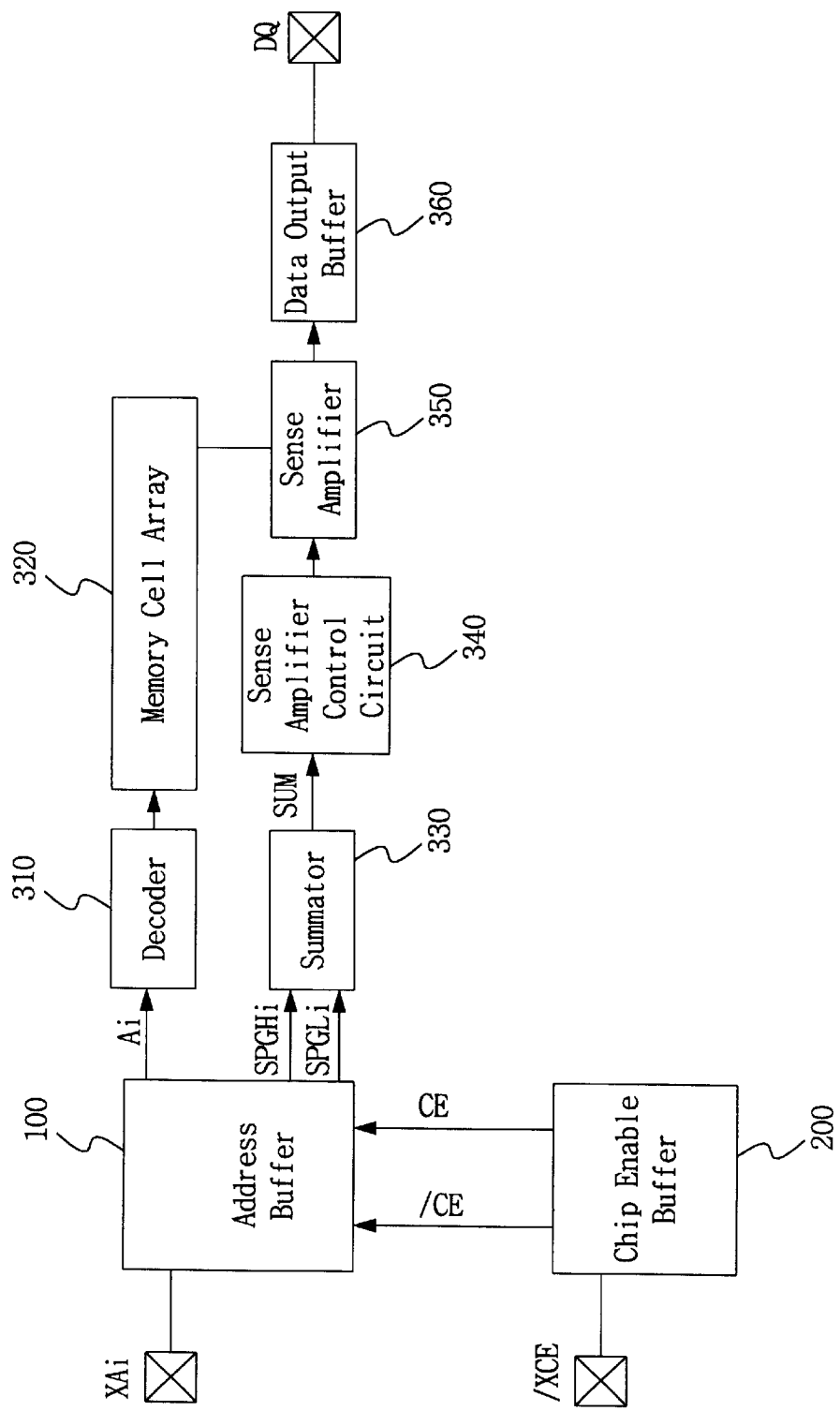
FIG. 5 is a block diagram of a semiconductor memory device in accordance with the present invention.

FIG. 5 is a block diagram of the semiconductor memory device for reading data according to an embodiment of the present invention. The semiconductor memory device includes an address buffer 100, a chip enable buffer 200, a decoder 310, a memory cell array 320, a summator 330, a sense amplifier control circuit 340, a sense amplifier 350, and a data output buffer 360.

The chip enable buffer 200 receives an external chip enable signal /XCE and generates first and second chip enable signals /CE and CE for controlling the semiconductor memory device to be enabled or disabled.

The address buffer 100 receives an external address signal XAi and generates an address signal Ai and first and second short pulses SPGHi and SPGLi in response to the first and second chip enable signals /CE and CE. The address signal Ai is transferred to the memory cell array 320 through the decoder 310 to select a memory cell transistor (not shown) of the memory cell array 320.

The summator 330 receives the short pulses SPGHi and SPGLi, each of which is correspondingly dependent on a variation of the corresponding external address signal XAi, and then generates a summation signal SUM which reflects the time variation or variance of the external address signal XAi.

The sense amplifier control circuit 340 is driven by the summation signal SUM. The sense amplifier control circuit 340 is operated whenever the short pulses SPGHi and SPGLi from the address buffer 100 are shifted according to the external address signal XAi.

The sense amplifier 350 effectively controlled by the sense amplifier circuit 340 reads information stored at the memory cell transistors in the memory cell array 320. Thus, the information from the memory cell array 320 are transferred to the data output buffer 360 and the data output buffer 360 outputs information DQ.

According to an embodiment of the present invention, the semiconductor memory device includes a plurality of address buffers (not shown) and a corresponding plurality of sense amplifiers (not shown).

Figure 6:
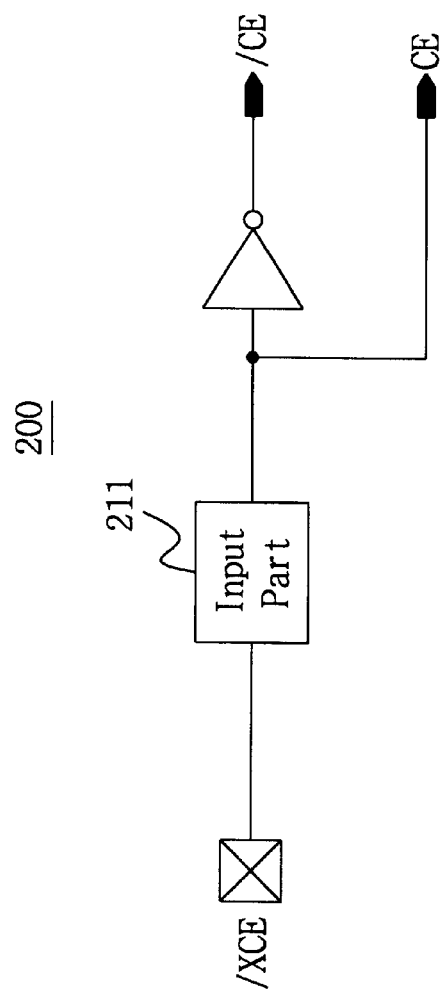
FIG. 6 is a block diagram of a chip enable buffer in accordance with the present invention.
Figure 7:
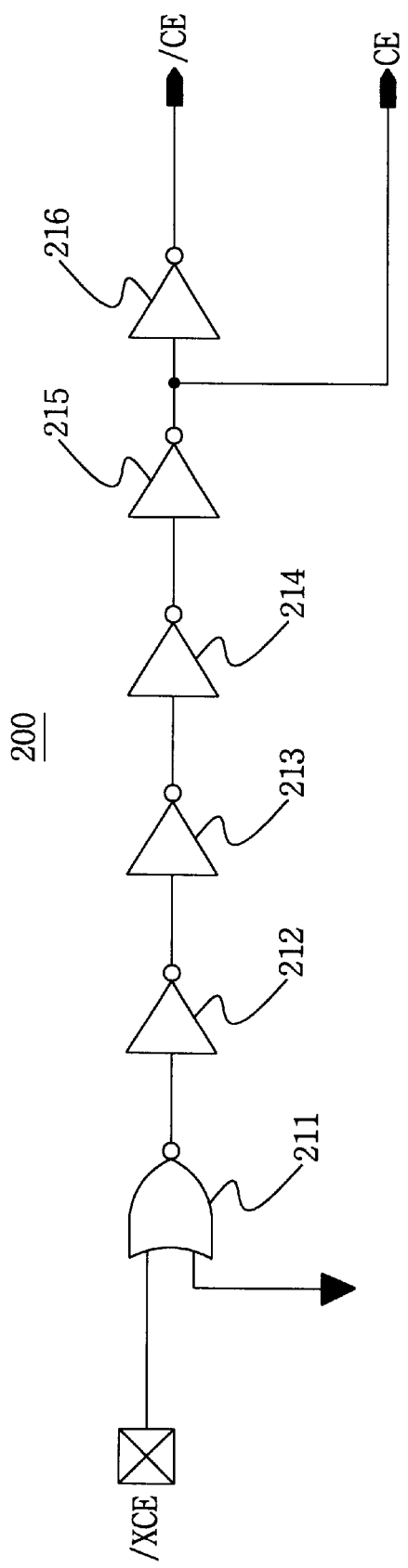
FIG. 7 is a circuit diagram of a chip enable buffer in accordance with the present invention.

FIG. 6 is a block diagram of the chip enable buffer 200 according to the present invention. FIG. 7 is a circuit diagram of the chip enable buffer 200. Referring to FIGS. 6 and 7, the chip enable buffer 200 receives the external chip enable signal /XCE and generates the first chip enable signal /CE and the second chip enable signal CE having an opposite phase with the first chip enable signal /CE. According to an embodiment of the present invention, the chip enable buffer 200 includes an input part having a NOR gate 211, a delay circuit including a plurality of inverters 212–215 in series. The delay circuit amplifies an output signal of the NOR gate 211, provides load driving capability, and phase adjust the output signal of the NOR gate 211. The input part generates the second chip enable signal CE. An inverter 216 receiving the second chip enable signal CE and generates the first chip enable signal /CE.

Figure 8:
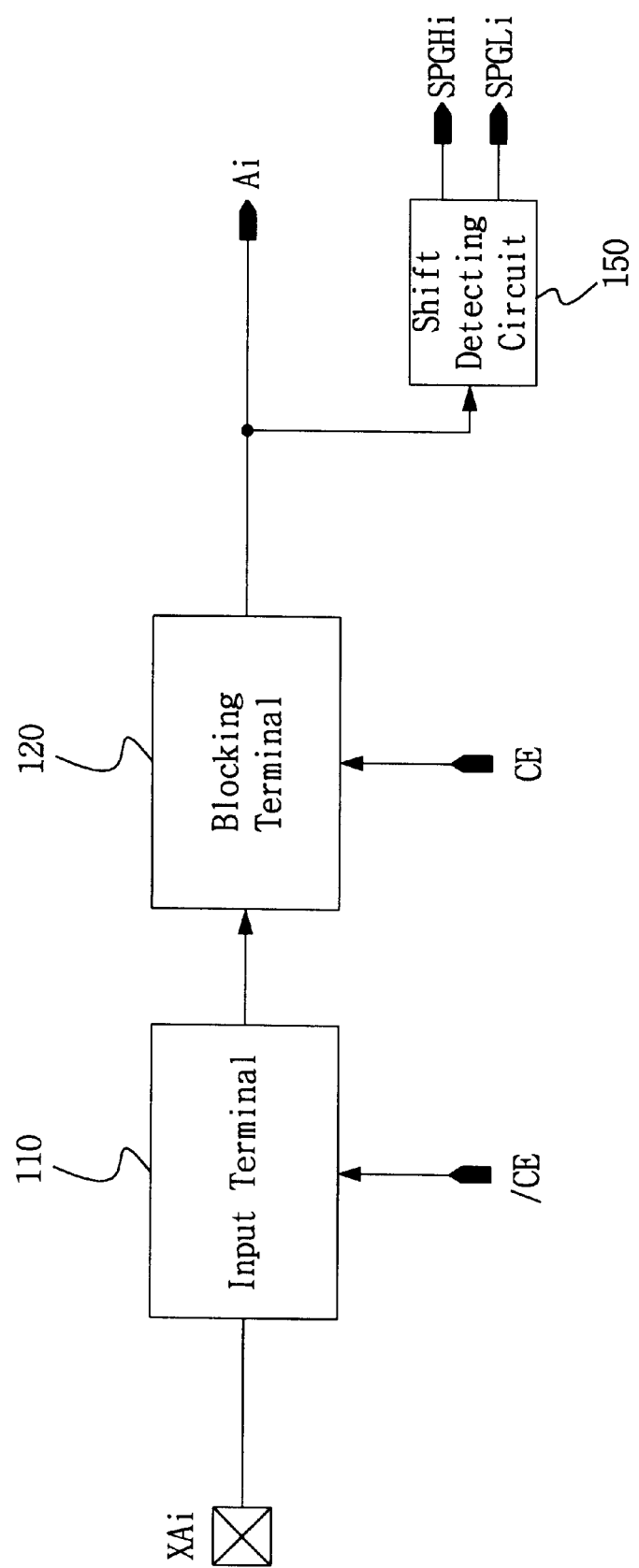
FIG. 8 is a block diagram of an address buffer in accordance with the present invention.
Figure 9:
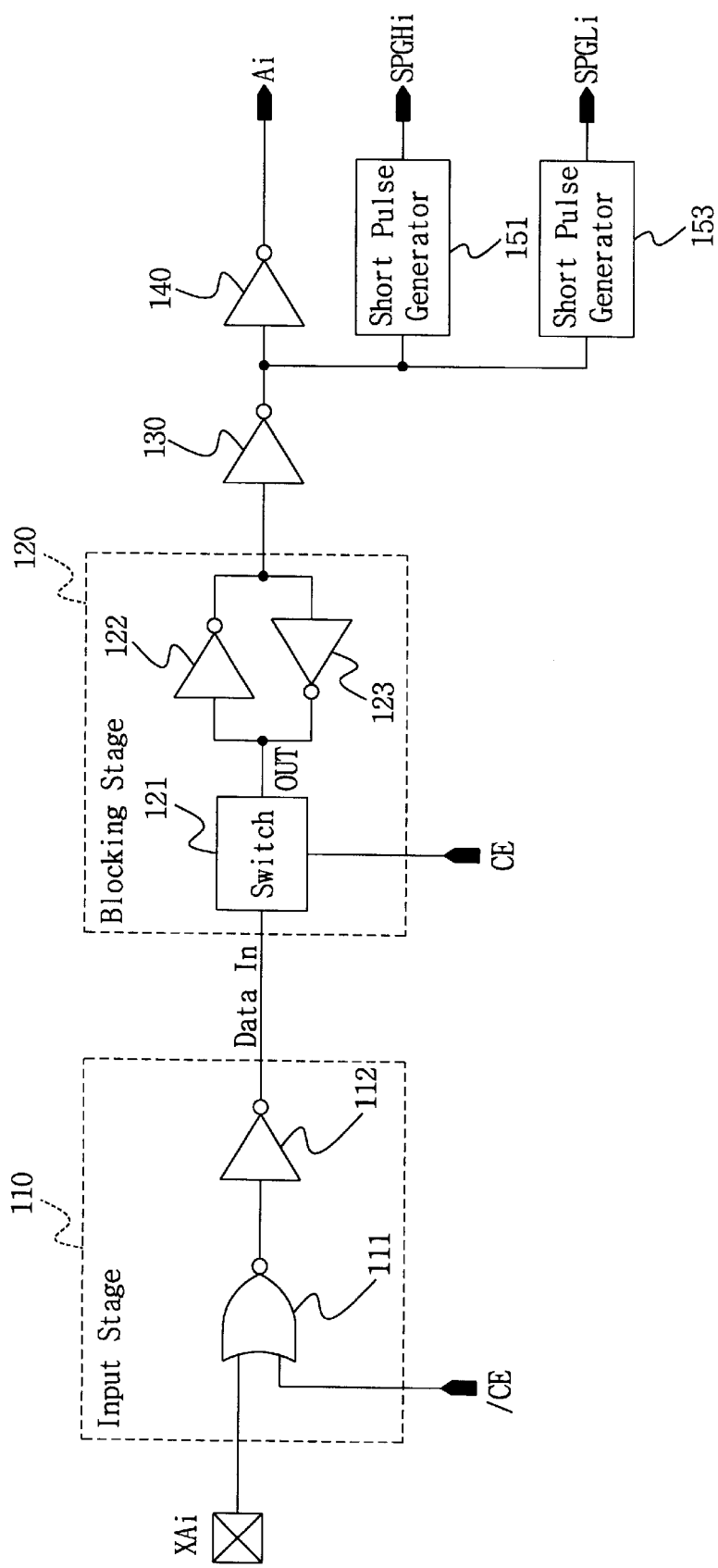
FIG. 9 is a circuit diagram of an address buffer in accordance with the present invention.

FIG. 8 is a block diagram of the address buffer 100 according to an embodiment of the present invention. FIG. 9 is a circuit diagram of the address buffer 100. Referring to FIGS. 8 and 9, the address buffer 100 includes an input terminal 110, a blocking terminal 120 connected to the input terminal 110, a shift detecting circuit 150 connected to the blocking terminal 120 According to an embodiment of the present invention, the address buffer 100 further includes inverters 130 and 140 connected to the blocking terminal 120.

According to an embodiment of the present invention, the input terminal 110 includes a NOR gate 111 and an inverter 112 connected to the NOR gate 111. One ordinary skilled in the art readily appreciates that any logic gates described herein can be substituted by a Boolean equivalent gate. For example, the input terminal 110 can use a NAND gate (not shown) instead of the NOR gate 111 and equivalent logic. The input terminal 110 receives the external address signal XAi and a first chip enable signal /CE. The inverter 112 inverts and amplifies an output signal of the NOR gate 111 and generates a Data-In signal.

The blocking terminal 120 includes a switch 121 and a latch having inverters 122 and 123 connected to the switch 121. The switch 121 receives the Data-In signal and transfers an output signal OUT to the latch in response to the second chip enable signal CE.

Figure 10:
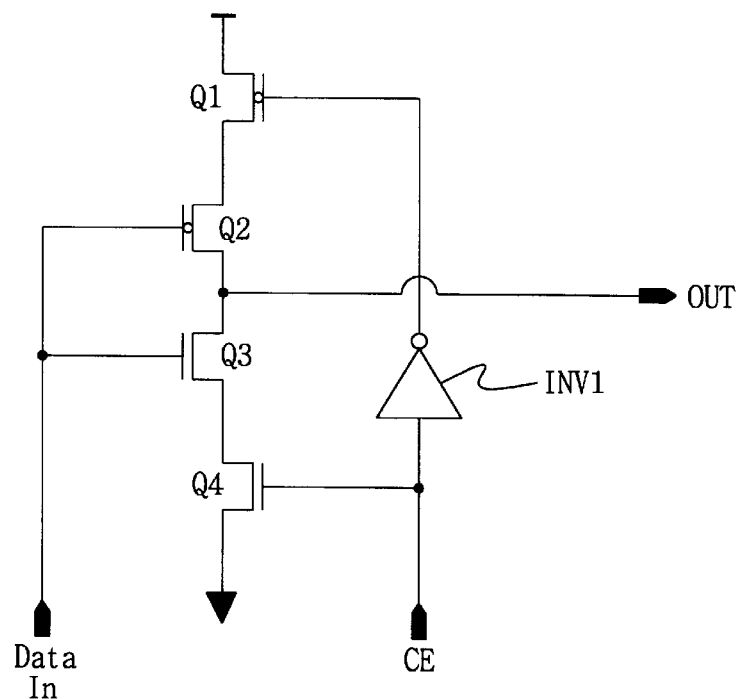
FIGS. 10 and 11 are circuit diagrams of switches in the address buffer in accordance with the present invention.

FIG. 10 is an exemplary circuit diagram of the switch 121 according to an embodiment of the present invention. Referring to FIG. 10, the switch 121 includes PMOS transistors Q1 and Q2, and NMOS transistors Q3 and Q4 connected in series. The PMOS transistor Q1 is connected to Vcc or logic 'high' and the NMOS transistor Q4 is connected to Vss, GND, or logic 'low'. The Data-In signal is input to gates of the PMOS transistor Q2 and the NMOS transistor Q3. The chip enable signal CE is connected to a gate of the NMOS transistor Q4 and is connected to a gate of the PMOS transistor Q1 through an inverter INV1. An output signal OUT of the switch 121 is connected to a connecting node of the PMOS transistor Q2 and the NMOS transistor Q3. Thus, if the Data-In signal is logic 'high' and the second chip enable signal CE is logic 'high', the output signal OUT is logic 'low'. If the Data-In signal is logic 'low' and the second chip enable signal CE is logic 'high', the output signal OUT is logic 'high'. If the second chip enable signal CE is logic 'low', the output signal OUT is floated.

Figure 11:
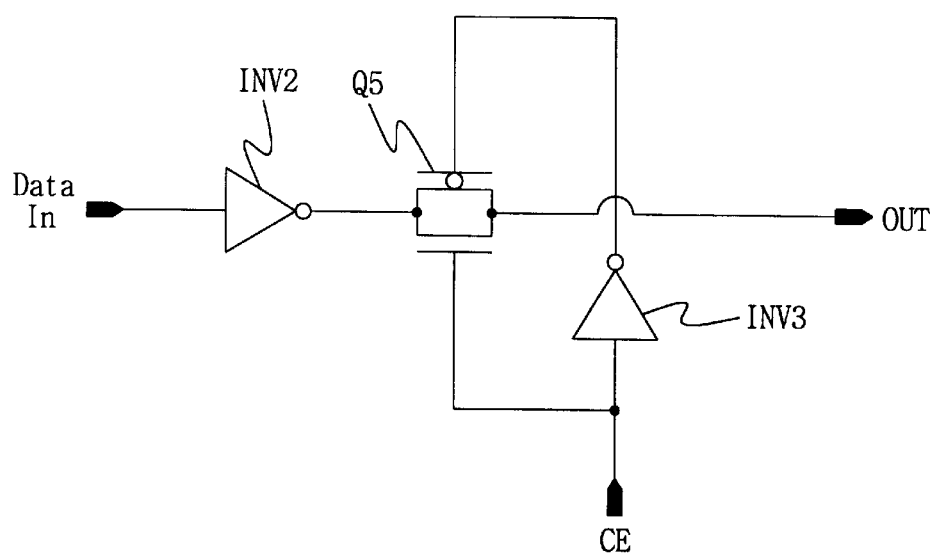

FIG. 11 is another exemplary circuit diagram of the switch 121 according to an embodiment of the present invention. Referring to FIG. 11, the switch 121 includes an inverter INV2, a transistor Q5 having interconnected PMOS and NMOS transistors, and an inverter INV3. The Data-In signal is input to one side of transistor Q5 and the second chip enable signal CE is transferred to a gate of the NMOS transistor of the transistor Q5 and a gate of the PMOS transistor of the transistor Q5 through the inverter INV3. If the second chip enable signal CE is logic 'high', the output signal OUT of the switch 121 is the same logic level as the Data-In signal, and is transferred to the latch. Likewise in FIG. 10, if the second chip enable signal CE is logic 'low', the output signal OUT of the switch 121 is floated. Accordingly, the switch 121 is opened or closed by the second chip enable signal CE.

Referring again to FIG. 9, the latch having the inverter 122 and 123 receives the output signal OUT from the switch 121 as an input to store the output signal OUT if the switch 121 is on. Additionally, the latch prevents an input to the inverter 130 from being floated when the switch 121 is off. The latch also prevents the generation of a triggering short pulse due to noise even if the switch 121 is not completely off. Therefore, the address buffer 100 prevents any false operations of the semiconductor memory device due to noise generated short pulses.

The inverters 130 and 140 connected to the block terminal 120 are for amplifying an output signal of the block terminal 120 and provides load driving capability.

According to an embodiment of the present invention, the shift detecting circuit 150 (in FIG. 8) includes a first short pulse generator 151 and a second short pulse generator 153. The first short pulse generator 151 is for sensing the shift of signal logic from 'low' to 'high' at the end of the first inverter 130 and generates the first short pulse SPGHi. The second short pulse generator 153 is for sensing the shift of signal logic from 'high' to 'low' at the end of the first inverter 130 and generates the second short pulse SPGLi.

Figure 12:
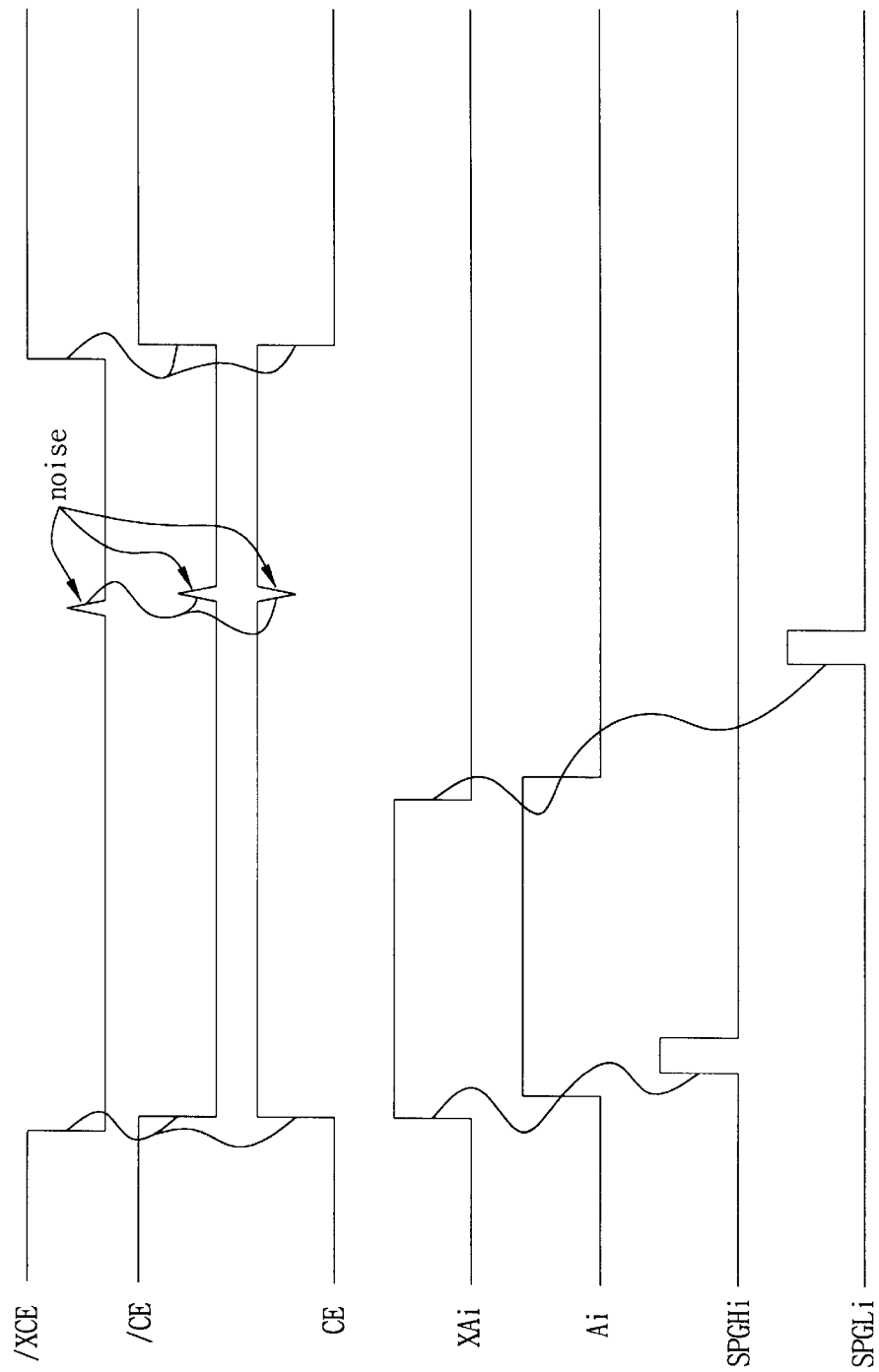
FIG. 12 is an operational timing diagram of the semiconductor memory device shown in FIG. 5.

FIG. 12 is an operational timing diagram of the semiconductor memory device shown in FIG. 5. As shown in FIG. 12, when the external chip enable signal XAi includes noise, the second chip enable signal CE having opposite phase to the first chip enable signal /CE is generated in the chip enable buffer 200, the address signal Ai is not influenced by the noise.

Therefore, the address buffer 100 of the present invention will not generate a short pulse to bring about false operations of the semiconductor memory device, even when noise is present. The chip enable buffer 200 is applied as shown in the operational timing view of FIG. 12, and can also prevent unnecessary consumption of current when the chip enable circuit is disabled.

As described above, there is an advantage in the present invention in that there will be no false operations in a semiconductor device even when noise is included in an external address signal. Besides, the semiconductor memory device does not consume current when an address buffer is disabled by a chip enable signal. Furthermore, a chip enable buffer does not need to generate a short pulse for operating a summator.

Although the detailed description of the present invention has been made with reference to the preferred embodiments, it should be noted that a variety of modifications may be made without the departure from the scope of the present invention. Thus, the scope of the present invention should not be limited within the preferred embodiments, but equivalent to the scope of claims that will be described below.

What is claimed is:

1. A semiconductor memory device, comprising:
   a chip enable buffer generating first and second control signals having opposite phases of logic, the first and second control signals enabling and disabling operations of the semiconductor memory device, respectively; and
   an address buffer comprising an input terminal, and a blocking terminal connected to the input terminal, the input terminal receiving an external address signal under control of the first control signal, and the blocking terminal generating an address signal in response to the second control signal.

2. The semiconductor memory device of claim 1, wherein the address buffer further comprising a shift detecting circuit connected to the blocking terminal for generating first and second short pulses by detecting shift of the address signal, wherein the pulses are used as signals for reading data of the semiconductor memory device.

3. The semiconductor memory device of claim 2, further comprising an inverter between the blocking terminal and the shift detecting circuit.

4. The semiconductor memory device of claim 2, wherein the shift detecting circuit comprises:
   a first short pulse generator generating the first short pulse when the shift of the address signal is changed from logic 'low' in logic 'high' and
   a second short pulse generator generating the second short pulse when the shift of the address signal is changed from logic 'high' in logic 'low'.

5. The semiconductor memory device of claim 1, wherein the input terminal comprises a NOR gate receiving the external address signal and the input terminal generates a data-in signal in response to the first control signal.

6. The semiconductor memory device of claim 5, wherein the input terminal further comprises an inverter.

7. The semiconductor memory device of claim 1, wherein the input terminal includes a NAND gate receiving the external address signal and generating a data-in signal in response to the first control signal.

8. The semiconductor memory device of claim 1, wherein the blocking terminal comprises:
   a switch receiving the data-in signal and generating an output signal by opening or closing in response to the second control signal; and
   a latch for storing the output signal, preventing generation of a false pulse due to noise, and generating the address signal.

9. The semiconductor memory device of claim 8, wherein the switch comprises:
   first and second PMOS transistors; and
   first and second NMOS transistors,
   wherein the first PMOS transistor, the second PMOS transistor, the first NMOS transistor, and the second NMOS transistor are connected in series, the first PMOS transistor is connected to logic 'high' and the second NMOS transistor is connected to logic 'low', the data-in signal is input to gates of the second PMOS transistor and the first NMOS transistor, the second control signal is connected to gates of the second NMOS transistor and the first PMOS transistor through an inverter, and the output signal of the switch is connected to a connecting node of the second PMOS transistor and the first NMOS transistor.

10. The semiconductor memory device of claim 8, wherein the switch comprises:
    interconnected PMOS and NMOS transistors; and
    an inverter,
    wherein the data-in signal is input to one side of the interconnected PMOS and NMOS transistors, and the second control signal is input to a gate of the NMOS transistor and a gate of the PMOS transistor through the inverter.

11. The semiconductor memory device of claim 1, wherein the chip enable buffer comprises:
    a input part receiving an external chip enable signal and generating the first control signal; and
    a plurality of inverters in series connected to the input part for amplifying the first control signal;
    an inverter for generating the second control signal, wherein the inverter connected to the plurality of inverters.

12. The semiconductor memory device of claim 9, wherein the input part is a NOR gate.

13. A semiconductor memory device, comprising:
    a chip enable buffer generating first and second control signals having opposite phases of logic, the first and second control signal enabling or disabling operations of the semiconductor memory device;
    an address buffer receiving an external address signal controlled by the first control signal and, generating an address signal in response to the second control signal, and generating first and second short pulses by detecting shift of the address signal;
    a memory cell array including memory cell transistors having data, the memory cell array receiving the address signal;
    a sense amplifier control circuit for receiving the first and second short pulses; and
    a sense amplifier for reading the data in the memory cell array in response to the first and second short pulses.

14. The semiconductor memory device of claim 13, wherein the chip enable buffer comprises:
    a input part receiving an external chip enable signal and generating the first control signal; and
    a plurality of inverters in series connected to the input part for amplifying the first control signal;
    an inverter for generating the second control signal, wherein the inverter connected to the plurality of inverters.

15. The semiconductor memory device of claim 13, wherein the address buffer comprising an input terminal, and a blocking terminal connected to the input terminal, the input terminal receiving an external address signal controlled by the first control signal, the blocking terminal generating an address signal in response to the second control signal, and a shift detecting circuit connected to the blocking terminal for generating first and second short pulses by detecting shift of the address signal.

16. The semiconductor memory device of claim 15, further comprising an inverter between the blocking terminal and the shift detecting circuit.

17. The semiconductor memory device of claim 15, wherein the shift detecting circuit comprises:

a first short pulse generator generating the first short pulse when the shift of the address signal is changed from logic 'low' to logic 'high' and a second short pulse generator generating the second short pulse when the shift of the address signal is changed from logic 'high' to logic 'low'.

18. A method for generating an address signal in a semiconductor memory device, the method comprising the steps of:

generating first and second control signals;

receiving an external address signal in response to the first control signal; and generating the address signal by filtering the external address signal in response to the second control signal.

19. The method of claim 18, wherein the first and second control signals are opposite phase each other.

20. The method of claim 18, further comprising the steps of;

generating a first short pulse when shift of the address signal is changed from logic 'low' to logic 'high' and generating a second short pulse when shift of the address signal is changed from logic 'high' to logic 'low'.

* * * * *